(12) United States Patent
Ueno et al.

(10) Patent No.: US 8,716,822 B2
(45) Date of Patent: May 6, 2014

(54) BACK-ILLUMINATED TYPE SOLID-STATE IMAGING DEVICE AND METHOD OF MANUFACTURING THE SAME

(75) Inventors: Risako Ueno, Tokyo (JP); Kazuhiro Suzuki, Tokyo (JP); Hideyuki Funaki, Tokyo (JP); Yoshinori Iida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/363,801

(22) Filed: Feb. 1, 2012

(65) Prior Publication Data

US 2012/0133011 A1 May 31, 2012

Related U.S. Application Data

(63) Continuation of application No. PCT/JP2009/065757, filed on Sep. 9, 2009.

(51) Int. Cl.
*H01L 31/0232* (2006.01)

(52) U.S. Cl.
USPC ........... 257/432; 257/228; 257/294; 257/233; 438/35; 438/66

(58) Field of Classification Search
CPC ............ H01L 27/1463; H01L 27/1464; H01L 27/14689; H01L 27/14621; H01L 27/14627
USPC .......... 257/294, 228, 233, 431, 432, E31.127; 438/35, 66
See application file for complete search history.

(56) References Cited

U.S. PATENT DOCUMENTS 4,694,185 A * 9/1987 Weiss ......................... 250/208.1
5,244,817 A 9/1993 Hawkins et al.

(Continued)

FOREIGN PATENT DOCUMENTS

| JP | 7-14996 | 1/1995 |
|---|---|---|
| JP | 2005-20024 | 1/2005 |
| JP | 2005-191262 | 7/2005 |
| JP | 2006-93319 | 4/2006 |
| JP | 2006-128392 | 5/2006 |

OTHER PUBLICATIONS

The International Preliminary Report on Patentability and Written Opinion issued Apr. 19, 2012, in International Application No. PCT/JP2009/065757 (International filed Sep. 9, 2009).

(Continued)

*Primary Examiner* — Kimberly Rizkallah
*Assistant Examiner* — Caleb Henry
(74) *Attorney, Agent, or Firm* — Oblon, Spivak, McClelland, Maier & Neustadt, L.L.P.

(57) ABSTRACT

A solid-state imaging device according to an embodiment includes: a plurality of pixels arranged on a first face of a first semiconductor layer, each of the pixels including a photoelectric conversion element converting light entering through a second face of the first semiconductor layer on the opposite side from the first face into a signal charge, the photoelectric conversion element having a pn junction formed with a first semiconductor region formed on the first face and a second semiconductor region formed on a surface of the first semiconductor region; pixel separating regions separating the pixels from one another and formed between the pixels, each of the pixel separating regions including a second semiconductor layer covering faces in contact with the photoelectric conversion elements, and an insulating film with a lower refractive index than a refractive index of the second semiconductor layer to cover the second semiconductor layer.

4 Claims, 7 Drawing Sheets

(56) References Cited

U.S. PATENT DOCUMENTS

| | | | |
|---|---|---|---|
| 5,602,414 A * | 2/1997 | Mitsui et al. | 257/442 |
| 6,541,298 B2 * | 4/2003 | Iida et al. | 438/54 |
| 6,833,549 B2 * | 12/2004 | Numai et al. | 250/370.14 |
| 6,891,242 B2 * | 5/2005 | Gidon et al. | 257/443 |
| 7,045,785 B2 * | 5/2006 | Iida et al. | 250/338.1 |
| 7,626,155 B2 * | 12/2009 | Yoshihara et al. | 250/208.1 |
| 7,884,436 B2 * | 2/2011 | Mabuchi | 257/432 |
| 7,902,618 B2 * | 3/2011 | Mao et al. | 257/431 |
| 8,178,938 B2 * | 5/2012 | Guidash | 257/432 |
| 2002/0139933 A1 * | 10/2002 | Iida et al. | 250/338.1 |
| 2003/0218120 A1 * | 11/2003 | Shibayama | 250/214.1 |
| 2004/0212719 A1 * | 10/2004 | Ikeda | 348/340 |
| 2005/0061980 A1 * | 3/2005 | Iida et al. | 250/338.4 |
| 2005/0139752 A1 * | 6/2005 | Min | 250/214.1 |
| 2005/0139943 A1 | 6/2005 | Kanbe | |
| 2006/0006438 A1 * | 1/2006 | Maruyama | 257/294 |
| 2006/0065896 A1 | 3/2006 | Abe et al. | |
| 2006/0094151 A1 * | 5/2006 | Sumi | 438/57 |
| 2006/0197007 A1 * | 9/2006 | Iwabuchi et al. | 250/208.1 |
| 2006/0281215 A1 * | 12/2006 | Maruyama et al. | 438/57 |
| 2007/0052050 A1 * | 3/2007 | Dierickx | 257/432 |
| 2007/0194397 A1 * | 8/2007 | Adkisson et al. | 257/432 |
| 2007/0284686 A1 * | 12/2007 | Liu et al. | 257/432 |
| 2008/0083939 A1 * | 4/2008 | Guidash | 257/292 |
| 2008/0170149 A1 * | 7/2008 | Iida et al. | 348/315 |
| 2008/0211050 A1 * | 9/2008 | Tay | 257/443 |
| 2008/0211939 A1 * | 9/2008 | Brady | 348/250 |
| 2008/0283726 A1 * | 11/2008 | Uya et al. | 250/208.1 |
| 2009/0098679 A1 | 4/2009 | Abe et al. | |
| 2009/0174017 A1 * | 7/2009 | Sumi | 257/431 |
| 2009/0242951 A1 | 10/2009 | Ueno et al. | |
| 2009/0261440 A1 * | 10/2009 | Kawasaki | 257/432 |
| 2010/0006963 A1 * | 1/2010 | Brady | 257/432 |
| 2010/0013039 A1 * | 1/2010 | Qian et al. | 257/432 |
| 2010/0123069 A1 * | 5/2010 | Mao et al. | 250/214.1 |
| 2010/0297805 A1 * | 11/2010 | Mabuchi | 438/73 |
| 2010/0330728 A1 * | 12/2010 | McCarten et al. | 438/70 |

OTHER PUBLICATIONS

International Search Report mailed Dec. 8, 2009 in PCT/JP2009/065757 filed Sep. 9, 2009 (in English).

H. Muraoka et al., "Controlled Preferential Etching Technology", Semiconductor Silicon 1973, Electrochemical Society, pp. 327-338 (in English).

Yasusuke Sumitomo et al., "Application of Selective Epitaxy and Preferential Etching of Silicon to Semiconductor Devices", Electrochemical Society, Abstract No. 25, 1972, pp. 74-76 (in English).

Office Action issued Sep. 20, 2013 in Japanese Patent Application No. 2011-530669 (with English translation).

* cited by examiner

BACK-ILLUMINATED TYPE SOLID-STATE IMAGING DEVICE AND METHOD OF MANUFACTURING THE SAME

CROSS REFERENCE TO RELATED APPLICATION

This application is based upon and claims the benefit of priority from prior PCT/JP 2009/065757, filed on Sep. 9, 2009, the entire contents of which are incorporated herein by reference.

FIELD

Embodiments described herein relate generally to a solid-state imaging device of a back-illuminated type and a method of manufacturing the solid-state imaging device.

BACKGROUND

In a conventional CMOS image sensor, photodiodes that are photoelectric converters to form pixels are formed in an array on a first face of a semiconductor substrate on the light incident side, and transistors for reading the charges converted by the photodiodes, wiring layers, and the like are also formed on the same first face above the photodiodes. Therefore, the aperture size relative to the light incident faces of the photodiodes is limited by the existence of the wiring layers and the transistors, and a 100% aperture ratio cannot be obtained. As a result, the incident light use efficiency has been poor.

To counter this problem, a technique of applying a structure of a back-illuminated type in which light is incident on a second face on the opposite side from the wiring layers to CMOS image sensors has been recently suggested as a technique for dramatically increasing aperture ratios. In a structure of a back-illuminated type, the wiring layers, the transistors for reading, and the like are formed on the first face of a semiconductor substrate, and a photodiode array that photoelectrically converts light into signals is formed on the second face to be the light-illuminated face. Color filters and the like for dividing incident light into wavelength regions, such as R (red), G (green), and B (blue) are formed on the light-illuminated face, and microlenses for gathering light are further formed on the color filters.

In the conventional structure of the back-illuminated type, however, it is difficult to prevent electrical color mixing that occurs due to movement of photoelectrically-converted charges to adjacent pixels, and increase the light use efficiency at the same time. To prevent electrical color mixing, a technique such as separation by potentials using pn junctions through ion implantation is used, for example. However, if high-density impurity ions are implanted to strengthen the pixel separation by potentials in a pixel array having a pixel pitch narrower than 2 μm, the pixel separating regions become wider, and the sensitivity becomes lower in short-wavelength regions.

In view of this, as suggested in the back-illuminated type, for example, a trench separator in which a trench that is often used as a device separator in miniaturized LSIs is filled with an oxide film is used in each pixel separating region, so as to prevent electrical color mixing. In a case where such trench separators are used for pixel separation in a solid-state imaging device, however, the dark current generated from the interface states between Si and $SiO_2$ existing in the sidewalls of the trench separators increases noise components.

Also, since the trench separators are formed on the wiring side, each of the trench separators has a tapered shape having a wider aperture on the wiring side. Therefore, if the trench separators are used in a solid-state imaging device of a back-illuminated type, each of the trench separators has a tapered shape with a narrower trench aperture on the light incident face. As a result, incident light passes through the photodiodes, and easily reaches the trench portions, causing the problem of optical color mixing.

DETAILED DESCRIPTION

A solid-state imaging device according to an embodiment includes: a first semiconductor layer of a first conductivity type; a plurality of pixels arranged in a matrix form on a first face of the first semiconductor layer, each of the pixels including a photoelectric conversion element that converts light entering through a second face of the first semiconductor layer on the opposite side from the first face into a signal charge, the photoelectric conversion element storing the signal charge, the photoelectric conversion element having a pn junction formed with a first semiconductor region formed on the first face of the first semiconductor layer and a second semiconductor region formed on a surface of the first semiconductor region, the first semiconductor being of a second conductivity type different from the first conductivity type, the second semiconductor region being of the first conductivity type; pixel separating regions separating the pixels from one another, the pixel separating region being formed between the pixels, each of the pixel separating regions including a second semiconductor layer of the first conductivity type covering faces in contact with the photoelectric conversion elements, and an insulating film with a lower refractive index than a refractive index of the second semiconductor layer to cover the second semiconductor layer; transistors formed in the second semiconductor regions of the respective pixels, the transistors reading the signal charges from the pixels; an insulating layer covering the plurality of pixels, the pixel separating regions, and the transistors; wiring layers that are formed in the insulating layer and drive the plurality of pixels; and a supporting substrate bonded to a face of the insulating layer on the opposite side from the plurality of pixels.

The following is a description of embodiments of the present invention, with reference to the accompanying drawings.

First Embodiment

Figure 1:
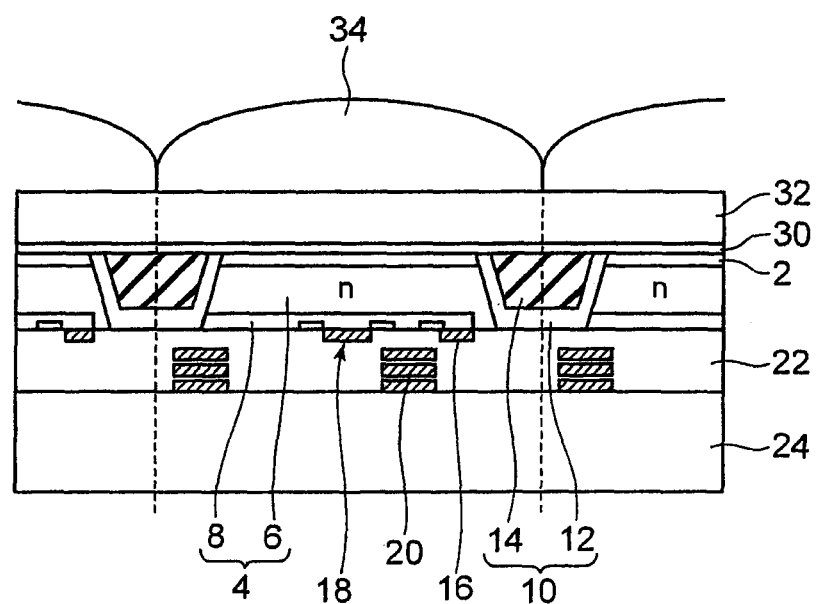
FIG. 1 is a cross-sectional view of a solid-state imaging device according to a first embodiment.
Figure 2:
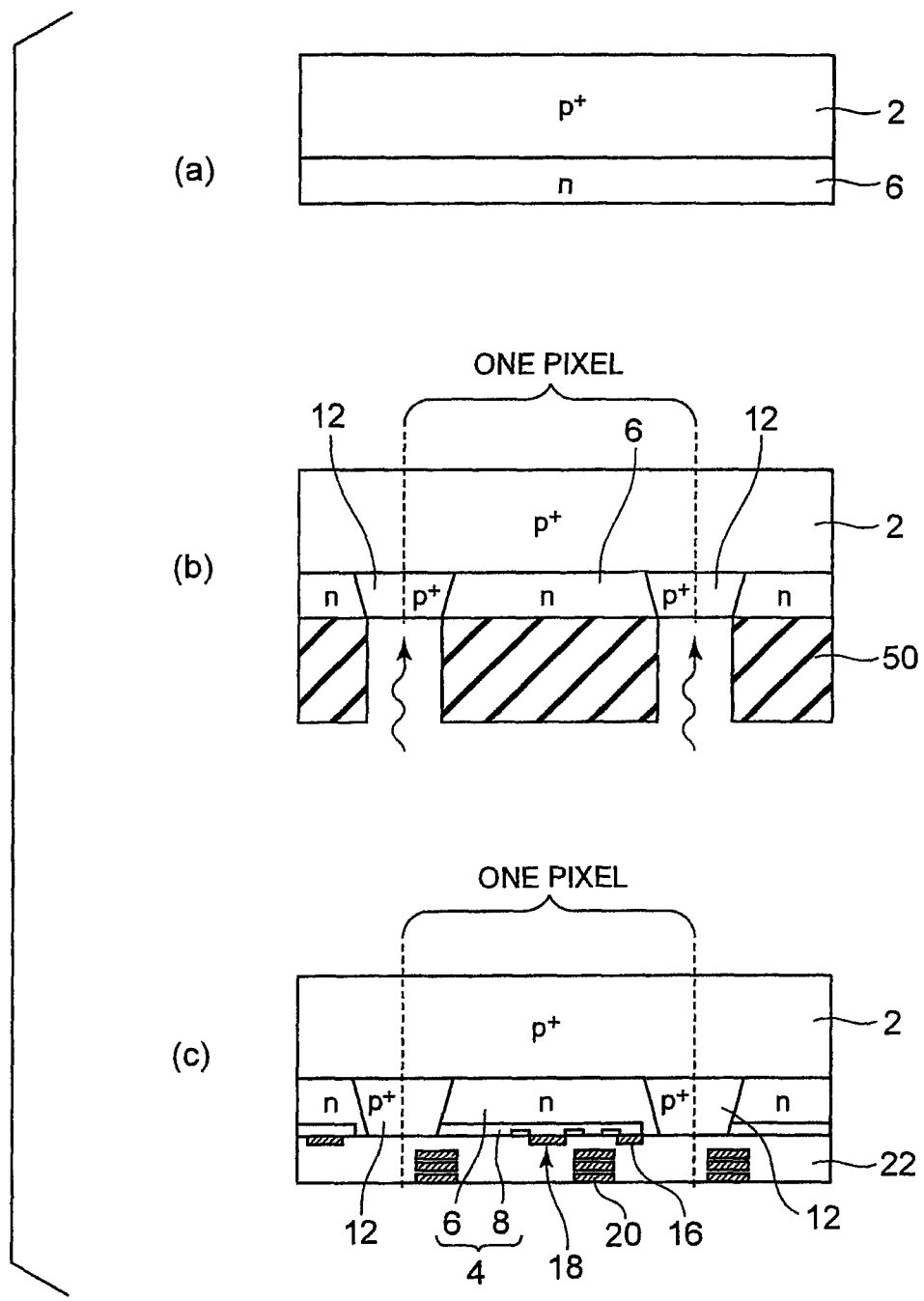
FIGS. 2(a) through 2(c) are cross-sectional views illustrating procedures for manufacturing a solid-state imaging device according to a second embodiment.
Figure 3:
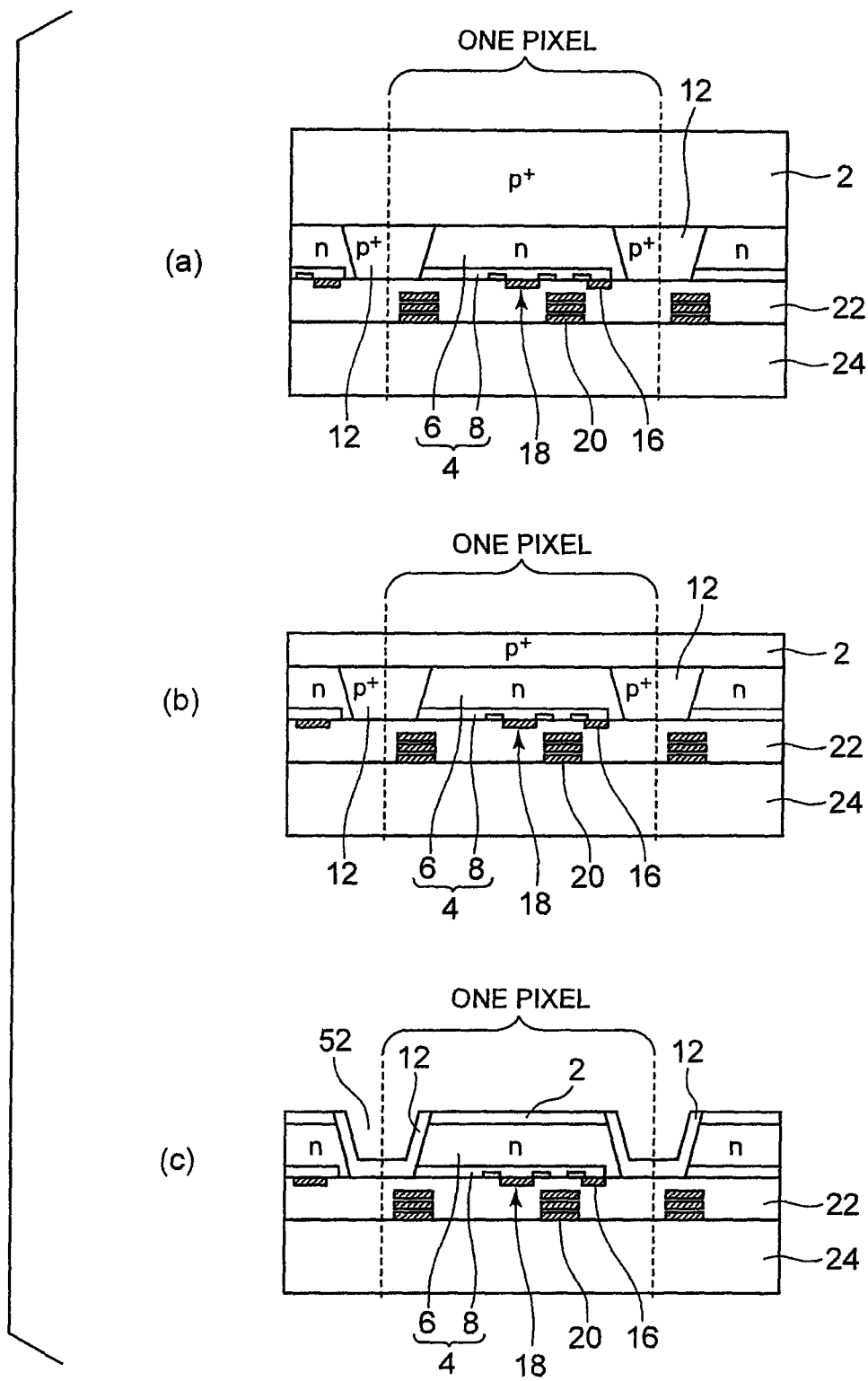
FIGS. 3(a) through 3(c) are cross-sectional views illustrating procedures for manufacturing a solid-state imaging device according to the second embodiment.

FIG. 1 shows a solid-state imaging device according to a first embodiment of the present invention. The solid-state imaging device of this embodiment includes pixels that are formed on a first face of a $p^+$-type semiconductor layer (a semiconductor substrate) 2 and are arranged in a matrix fashion, and each of the pixels includes a photodiode (a photoelectric conversion element) 4. The photodiodes 4 each include an n-type semiconductor region 6 formed on the first face of the $p^+$-type semiconductor layer 2, and a p-type semiconductor region 8 formed on a surface on the opposite side of the semiconductor region 6 from the semiconductor layer 2. The photodiodes 4 are isolated from one another by pixel separating regions 10. The pixel separating regions 10 each include a $p^+$-type semiconductor layer 12 and a low refractive index material film 14 having a lower refractive index than the refractive index of silicon. The pixel separating regions 10 each has a tapered shape with a cross-sectional area that becomes smaller toward the semiconductor region 6 from the semiconductor layer 2. The semiconductor layer 12 is formed to cover the bottom face and the tapered side faces in contact with the semiconductor regions 6. The low refractive index material film 14 is formed to cover the semiconductor layer 12. Alternatively, the semiconductor layer 12 may be formed only on the tapered side faces in contact with the semiconductor regions 6. As the low refractive index material, silicon oxide or a general low-k material (a low dielectric constant material (porous silica, a high polymer material, or the like)) can be used, for example.

In the p-type semiconductor region 8, a transfer transistor 16 that transfers (reads) signal charges stored in the n-type semiconductor region 6 of the photodiode 4, and a read circuit 18 including a transistor are provided. The n-type semiconductor region 8 also serves as one of the impurity layers that are to be the source and drain of the transfer transistor 16. The photodiode 4, the transfer transistor 16, and the read circuit 18 constitute one pixel. Each one read circuit 18 may be shared between two adjacent pixels or among four adjacent pixels. A potential control line (not shown) for controlling the potential of the p-type semiconductor region 8 of the photodiode 4 is also provided. The potential control line is a wiring shared among all the pixels, so that the potentials of all the pixels can be uniformly and accurately controlled. Uniformly and accurately controlling the potentials of all the pixels is critically important. For example, pixel potential control is essential in eliminating adverse influences of excess electrons and excess holes generated in a case where high-luminance imaging of an object is performed with a highlight beam entering each pixel.

Further, wiring layers 20 are provided on the opposite side of each pixel from the semiconductor layer 2, with an insulating film 22 being interposed in between. A supporting substrate 24 is bonded to the wiring layers 20 and the insulating film 22.

Also, a anti-reflection film 30 is formed to cover the pixel separating regions 10 and a second face of the semiconductor layer 2 on the opposite side from the first face, and color filter layers 32 of R (red), G (green), and B (blue) that correspond to the respective pixels are formed on the anti-reflection film 30. Microlenses 34 corresponding to the respective pixels are provided on the color filter layers 32. Accordingly, light beams enter the pixels via the microlenses 34, the color filter layers 32, and the anti-reflection film 30. That is, a back-illuminated structure is formed, and light beams enter the back-illuminated structure through the second face of the semiconductor layer 2 on which the wiring layers 20 are not formed. The n-type semiconductor region 6 of each pixel is covered with the $p^+$-type semiconductor layer 2 on the illuminated face side. This is to isolate a depletion layer formed with the photodiode from the interface between silicon and a silicon oxide film, and thereby obtain low dark currents. Although not shown in FIG. 1, the above mentioned silicon oxide film is provided between the semiconductor layer 2 and the anti-reflection film 30.

In the solid-state imaging device of this embodiment having the above structure, each pixel separating region 10 has a larger cross-sectional area on the light-illuminated face side than the cross-sectional area of the face through which light does not enter. With this arrangement, the n-type semiconductor region 6 of each photodiode 4 has a structure with a tapered shape having a narrow light incident face and a wide area on the wiring side. Therefore, when a light beam that obliquely enters the pixel array enters each photodiode 4, reflection easily occurs at the end faces between the photodiodes 4 and the pixel separating regions 10. Accordingly, oblique incident light that passes through the photodiodes 4 can be prevented from entering the pixel separating regions 10 as much as possible, and optical color mixing (crosstalk) can be prevented.

Next, the reason why oblique incident light that enters the photodiodes 4 and reaches the pixel separating regions 10 is reflected and does not enter the adjacent pixels is described. The low refractive index material film 14 of each pixel separating region 10 has a lower refractive index $n_2$ ($<n_1$) than the refractive index $n_1$ (=3.9) of silicon. Therefore, light that enters at shallower angles than a critical angle $\theta_c$ defined by "$\theta_c=\arcsin(n_2/n_1)$" is totally reflected, so that optical crosstalk is dramatically reduced. Since each pixel separating region 10 has a tapered shape with a larger cross-sectional area on the light-illuminated face side than the cross-sectional area of the face not illuminated with light, the angles at which incident light enters the pixel separating regions 10 become shallower, and the range in which optical crosstalk is prevented can be made even wider. In view of the above explanation, optical crosstalk can be prevented, as long as each pixel separating region 10 includes the low refractive index material film 14 though each pixel separating region 10 does not have a tapered shape with the larger cross-sectional area on the light-illuminated face side.

Also, in this embodiment, each pixel separating region 10 has the $p^+$-type semiconductor layer 12 in the faces in contact with the n-type semiconductor regions 6 of the photodiodes 4. Accordingly, dark currents generated from the interface states between silicon and silicon oxide can be reduced, and decreases in sensitivity can be prevented.

Second Embodiment

Referring now to FIGS. 2(a) through 8(b), a method of manufacturing a solid-state imaging device according to a second embodiment of the present invention is described. The manufacturing method according to this embodiment is a method of manufacturing the solid-state imaging device of the first embodiment illustrated in FIG. 1. In each of the procedures illustrated in FIGS. 2(a) through 2(c), the face to be processed is the face on the lower side.

First, as shown in FIG. 2(a), a semiconductor substrate having a semiconductor layer 6 of a second conductivity type (the n-type) epitaxially grown for photodiode formation on the first face of a silicon substrate 2 of a first conductivity type (the p+-type) is prepared. The n-type semiconductor layer 6 may be formed by implanting ions into the p+-type silicon substrate 2. The n-type semiconductor layer 6 is preferably 3 to 5 µm in thickness.

As shown in FIG. 2(b), a hard mask 50 made of silicon oxide or silicon nitride, for example, is formed on the n-type semiconductor layer 6, and p-type impurity ions are implanted into the n-type semiconductor layer 6 with the use of the hard mask 50, to form the p+-type semiconductor layers 12 of the pixel separating regions. The p+-type semiconductor layers 12 are formed to reach the p+-type silicon substrate 2. In general, ion implantation characteristically causes impurities to spread in a transverse direction almost perpendicular to the implanting direction (a direction almost perpendicular to the upper face of the semiconductor layer 6) as the depth of the ion implantation becomes deeper. Therefore, the p+-type semiconductor layers 12 each having an inverse tapered shape with the smaller area on the ion implantation side and the larger area on the side of the p+-type silicon substrate 2 are formed, as shown in FIG. 2(b). By the p+-type semiconductor layers 12, the n-type semiconductor layer 6 is divided into the n-type semiconductor regions 6 for respective pixels. After that, the hard mask 50 is removed.

As shown in FIG. 2(c), by using a known technique, the p-type semiconductor regions 8 are formed on the n-type semiconductor regions 6. The n-type semiconductor regions 6 and the p-type semiconductor regions 8 constitute the photodiodes 4. By using a known technique, the transfer transistors 16 and the read circuits 18 including transistors are formed in the p-type semiconductor regions 8. The transfer transistors 16 and the read circuits 18 are covered with the insulating film 22, and the metal wiring layers 20 for driving the transistors are formed in the insulating film 22. After the insulating film 22 is formed to cover the wiring layers 20, the insulating film 22 on the wirings is flattened. The resultant structure is illustrated in FIG. 2(c).

As shown in FIG. 3(a), the supporting substrate 24 that is a glass substrate, for example, is bonded to the flattened face of the insulating film 22.

Figure 4:
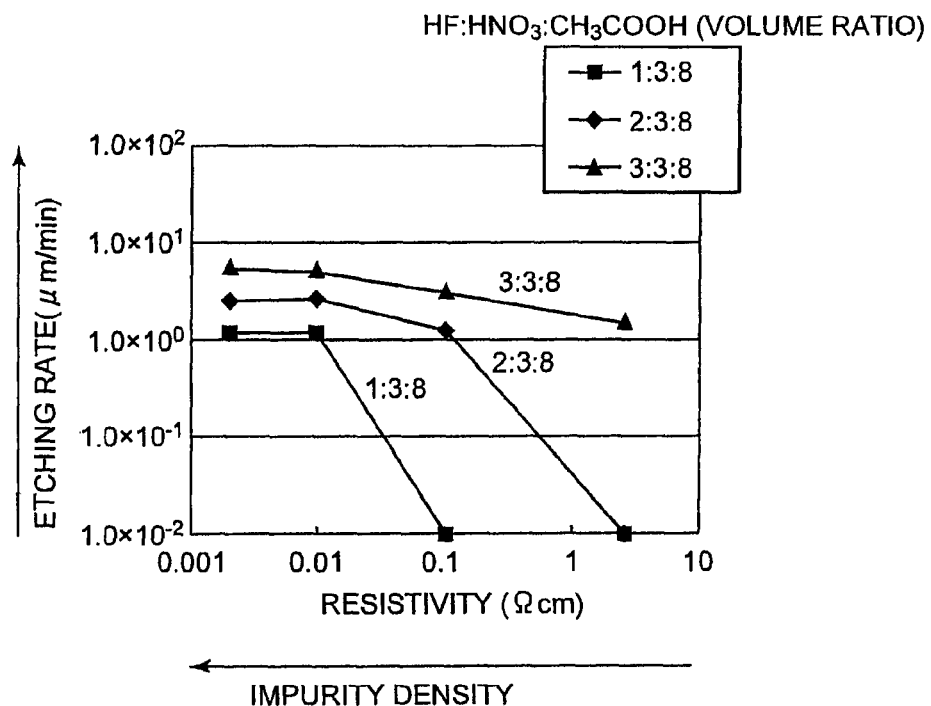
FIG. 4 is a graph showing the dependence of the etching rate on the composition of the etching solution and the impurity density.

As shown in FIG. 3(b), the second face of the silicon substrate 2 to be the light incident face (the face on the opposite side from the face (the first face) on which the n-type semiconductor layer 6 is formed) is subjected to grinding, CMP, wet etching, or a combination of those processes, to reduce the layer thickness to several tens of µm. Wet etching is then performed by using an etching solution having such a composition that etching stops in the p-type semiconductor layers formed by ion implantation. This etching solution is a mixed solution of hydrofluoric acid, nitric acid, and acetic acid. In the mixed solution, the density of the hydrofluoric acid is 49 weight % (containing HF), and the density of the nitric acid is 70 weight %. The volume ratio among hydrofluoric acid, nitric acid, and acetic acid is 1:3:8 to 3:3:8. Through the wet etching using the solution, the etching rate rapidly changes due to the resistivity or the impurity density, as shown in FIG. 4. It should be noted that the etching solution is disclosed by H. Muraoka in "Controlled Preferential Etching Technology" (Semicon. Silicon 1973) or by Y. Sumitomo in "Application of Selective Epitaxy and Preferential Etching of Silicon to Semiconductor Devices" (Electrochem. Soc. Extent. Abstr. 1972). Since the rate changing point varies with the composition of the etching solution, the impurity density in the end faces of the photodiodes to remain after the etching can be controlled by adjusting the solution concentration.

Figure 5:
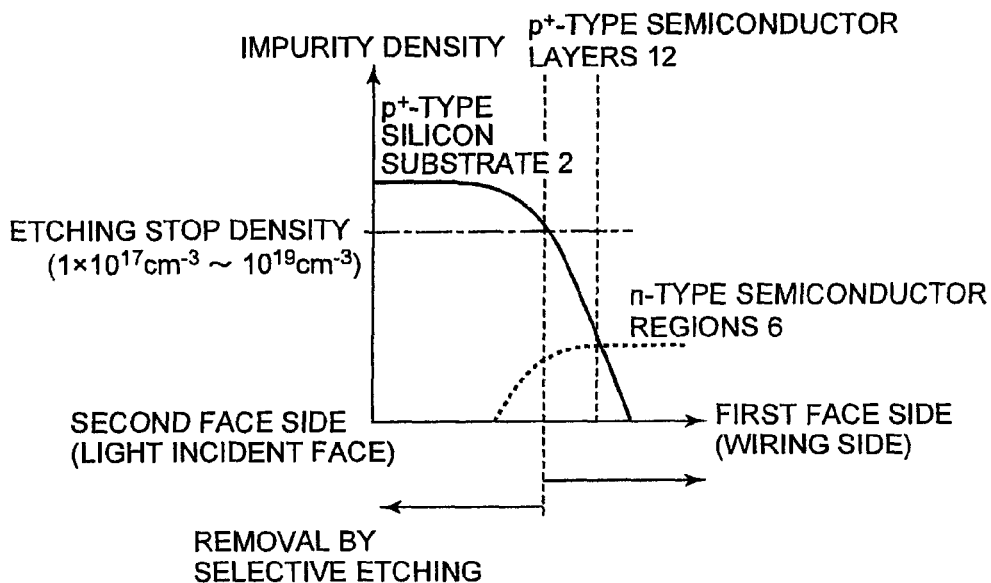
FIG. 5 is a diagram for explaining the Impurity density at which etching stops.
Figure 6:
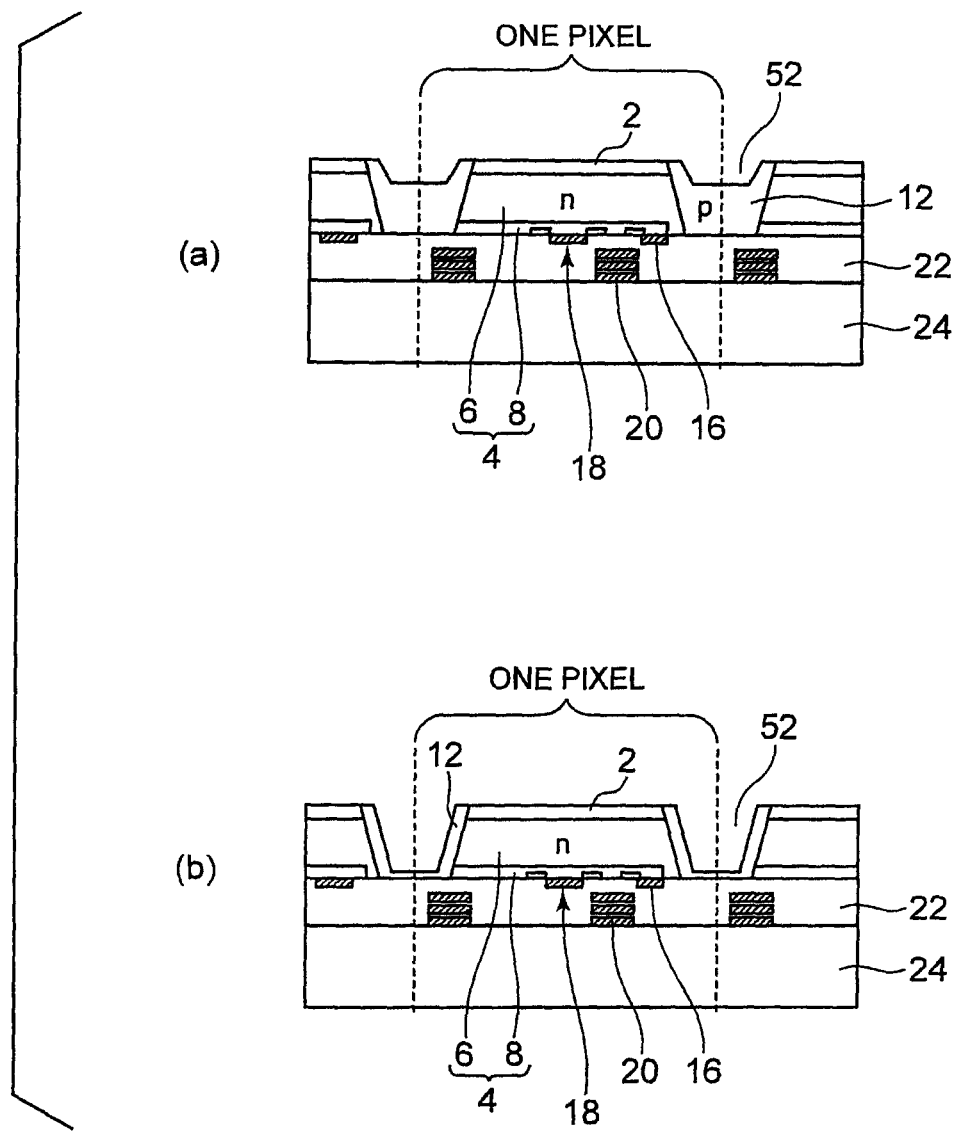
FIGS. 6(a) and 6(b) are cross-sectional views showing examples of concavities formed by etching.
Figure 7:
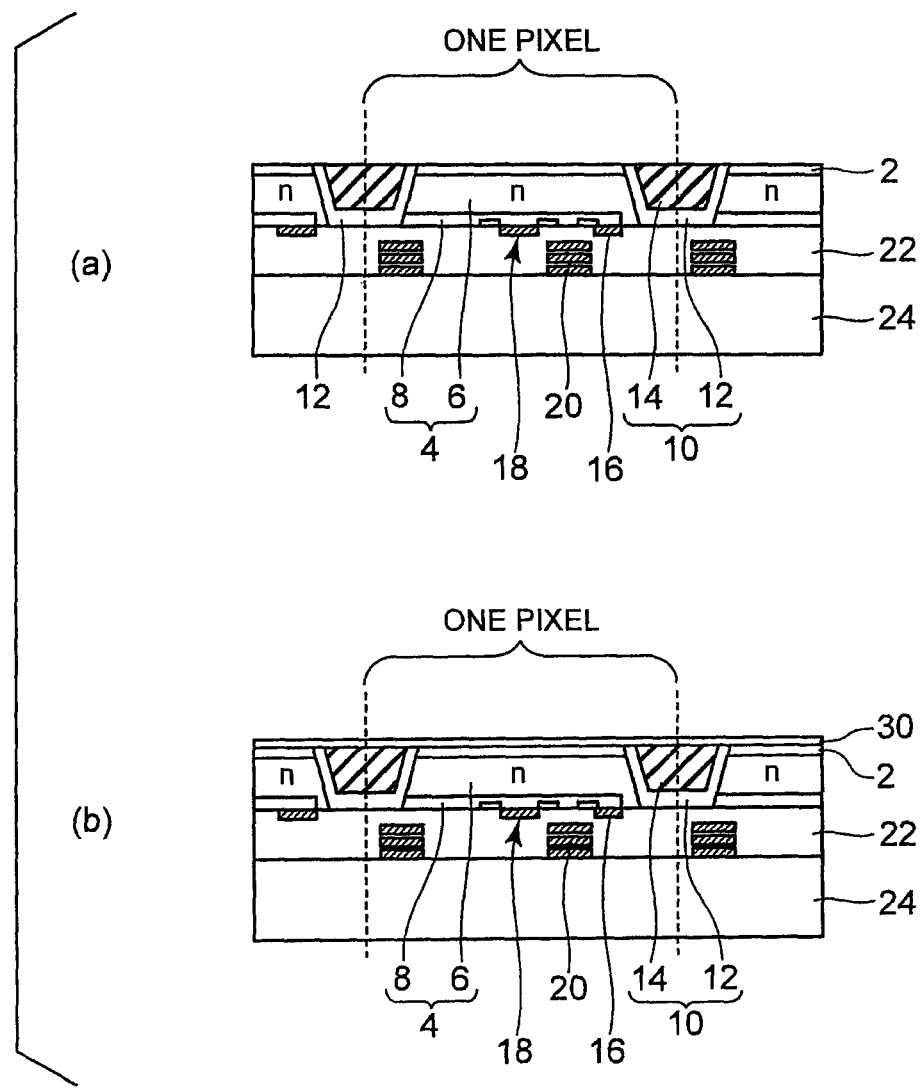
FIGS. 7(a) through 7(b) are cross-sectional views illustrating procedures for manufacturing a solid-state imaging device according to the second embodiment.
Figure 8:
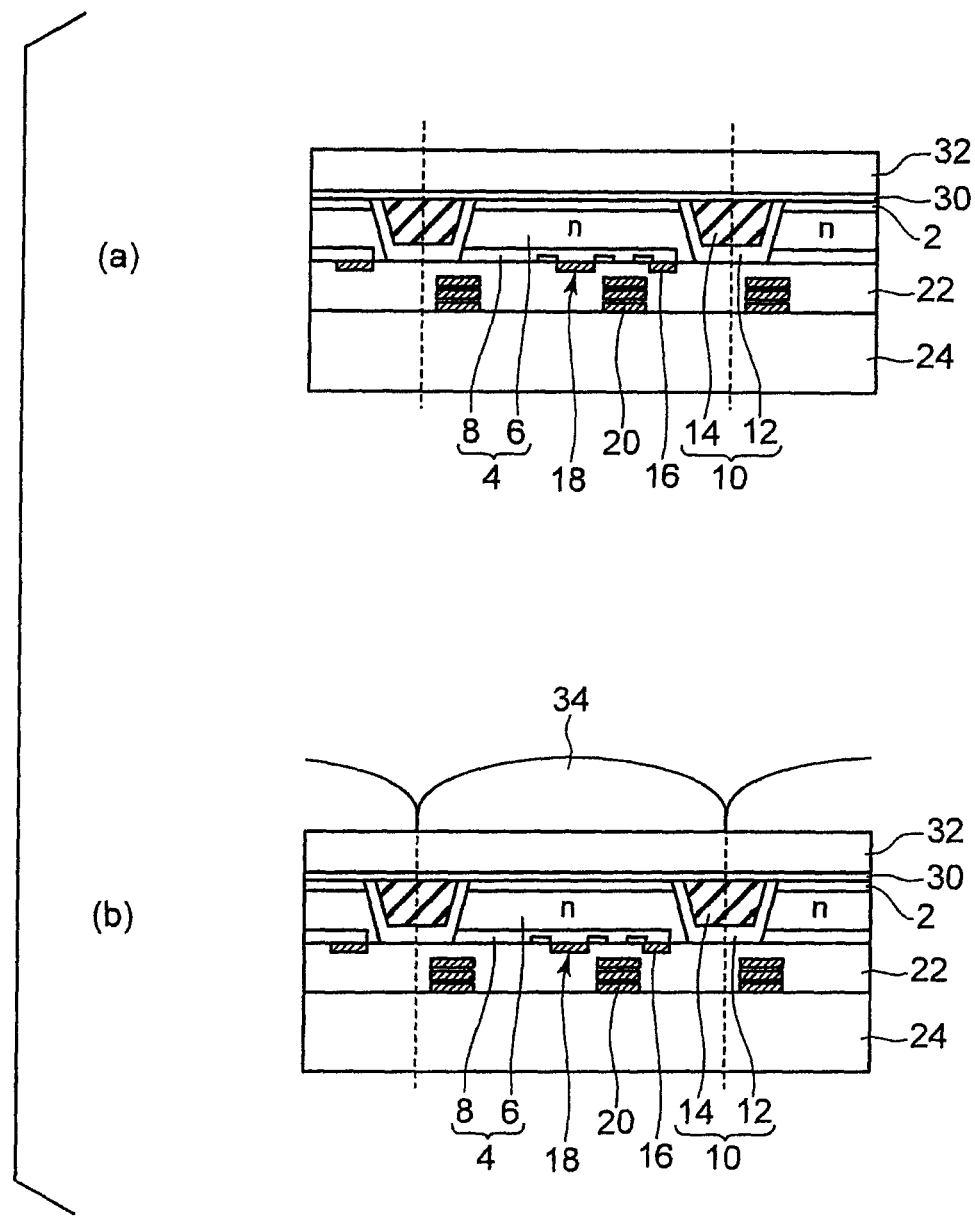
FIGS. 8(a) through 8(b) are cross-sectional views illustrating procedures for manufacturing a solid-state imaging device according to the second embodiment.

Through the wet etching, etching is performed on the p+-type silicon substrate 2 at a certain rate. As shown in FIG. 5, at a point when the p+-type silicon substrate 2 has a certain film thickness while the impurity density is becoming lower toward the first face from the second face of the silicon substrate 2, the etching rate becomes almost zero, and the etching stops. The p-type impurity density at which the etching of the silicon substrate 2 stops is $1\times10^{17}$ cm$^{-3}$ to $1\times10^{19}$ cm$^{-3}$. Therefore, in the p+-type semiconductor layer (semiconductor substrate) 2 shown in FIG. 2(a), the p-type impurity density in the vicinity of the face (the first face) on which the n-type semiconductor layer 6 is formed is in the range of $1\times10^{17}$ cm$^{-3}$ to $1\times10^{19}$ cm$^{-3}$, and the p-type impurity densities in the other regions are higher than the above range. Meanwhile, in the p+-type semiconductor layer 12 of each of the pixel separating regions 10, the Impurity density becomes higher toward the first face. Therefore, the etching further progresses, and concavities 52 are formed as shown in FIG. 3(c).

As shown in FIG. 6(a), the concavities 52 may be formed by performing etching on the p+-type semiconductor layers 12 until the etching reaches regions shallower than the locations of the p-type semiconductor regions 8 of the photodiodes 4. Alternatively, as shown in FIG. 6(b), the concavities 52 may be formed by performing etching on the p+-type semiconductor layers 12 until the concavities 52 become deeper than the locations of the p-type semiconductor regions 8 of the photodiodes 4. Even though the concavities 52 are formed in shallower regions than the locations of the p-type semiconductor regions 8 of the photodiodes 4 as shown in FIG. 6(a), optical crosstalk that occurs in shallow regions in the photodiodes 4 (regions in the vicinity of the silicon substrate 2) can be restrained. Where etching is performed until the concavities 52 become deeper than the locations of the p-type semiconductor regions 8 of the photodiodes 4 as shown in FIG. 6(b), crosstalk can be more effectively restrained at the components (such as red) with longer wavelengths that cause color mixing in deeper regions in the photodiodes 4. The etching depth can be set to a desired depth by setting the impurity density in the p+-type semiconductor layers 12 of the pixel separating regions 10 to an etchable density defined by the impurity density determined as shown in FIG. 4 and the composition combination in the mixed solution of hydrofluoric acid, nitric acid, and acetic acid.

As shown in FIG. 7(a), the concavities 52 are filled with an insulating film made of a material with a lower refractive index than that of silicon (a low refractive index material film) such as a silicon oxide film or a silicon nitride film, to flatten the light incident face (the second face). To use the second face subjected to the processing as the light illuminated face, surface processing is performed, and flattening is performed on the upper portion of the second face with a transparent flattening film (not shown). In this manner, the reflection preventing film 30 is formed (FIG. 7(b)). As shown in FIG. 8(a), the color filters 32 corresponding to the respective pixels are formed on the anti-reflection film 30, and the microlenses 34 are formed on the color filters 32 as needed (FIG. 8(b)).

As described above, the thickness of the p+-type silicon layer 2 can be controlled by using a mixed solution of hydrofluoric acid, nitric acid, and acetic acid at a solution composition ratio within a predetermined range. The p+-type silicon layer 2 is on the light incident face side. The p+-type silicon layer 2 on the light incident face side is an essential layer in a burled photodiode structure, and contributes to improvement in dark current characteristics and increases in sensitivity. Also, by using the manufacturing method according to this embodiment, etching can be stopped in the regions of the p+-type semiconductor layers having a certain impurity density. Accordingly, the p+-type semiconductor layers 2 and 12 can remain by certain widths on the light incident faces of the photodiodes 4 and at the interfaces between the n-type semiconductor layers 6 of the photodiodes 4 and the pixel separating regions 10. Thus, variations in sensitivity to blue due to variations in widths of the p$^+$-type semiconductor layers can be reduced.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A solid-state imaging device comprising:
a first semiconductor layer of a first conductivity type;
a plurality of pixels arranged in a matrix form on a first face of the first semiconductor layer, each of the pixels including a photoelectric conversion element that converts light entering through a second face of the first semiconductor layer on the opposite side from the first face into a signal charge, the photoelectric conversion element storing the signal charge, the photoelectric conversion element having a pn junction formed with a first semiconductor region formed on the first face of the first semiconductor layer and a second semiconductor region formed on a surface of the first semiconductor region, the first semiconductor region being of a second conductivity type different from the first conductivity type, the second semiconductor region being of the first conductivity type;
pixel separating regions separating the pixels from one another, the pixel separating regions being formed between the pixels, each of the pixel separating regions including a second semiconductor layer of the first conductivity type covering faces in contact with the photoelectric conversion elements, and an insulating film with a lower refractive index than a refractive index of the second semiconductor layer to cover the second semiconductor layer, each of the pixel separating regions having a tapered shape with a cross-sectional area that becomes smaller toward a face of the first semiconductor region on the opposite side from the first semiconductor layer, from the first face of the first semiconductor layer;
transistors formed in the second semiconductor regions of the respective pixels, the transistors reading the signal charges from the pixels;
an insulating layer covering the plurality of pixels, the pixel separating regions, and the transistors;
wiring layers that are formed in the insulating layer and drive the plurality of pixels; and
a supporting substrate bonded to a face of the insulating layer on the opposite side from the plurality of pixels.

2. The device according to claim 1, wherein the maximum distance between the first face of the first semiconductor layer and an opposed surface of the second semiconductor layer of each of the pixel separating regions is shorter than a distance from the first face to an interface between the first semiconductor region and the second semiconductor region, the opposed surface of the second semiconductor layer facing to the first face of the first semiconductor layer.

3. The device according to claim 1, wherein a maximum distance between the first face of the first semiconductor layer and an opposed surface of the second semiconductor layer of each of the pixel separating regions is longer than a distance from the first face to an interface between the first semiconductor region and the second semiconductor region, the opposed surface of the second semiconductor layer facing to the first face of the first semiconductor layer.

4. The device according to claim 1, wherein the first semiconductor layer has a first-conductivity-type impurity density in the range of $1\times10^{17}$ to $1\times10^{19}$ cm$^{-3}$.

* * * * *